(12) United States Patent  
Sakamoto

(10) Patent No.: US 9,400,437 B2  
(45) Date of Patent: Jul. 26, 2016

(54) POSITION MEASUREMENT APPARATUS AND EXPOSURE APPARATUS WHICH MEASURE POSITION OF OBJECT USING REFERENCE MARK, AND METHOD OF MANUFACTURING DEVICE

(71) Applicant: CANON KABUSHIKI KAISHA, Tokyo (JP)

(72) Inventor: Noritoshi Sakamoto, Shimotsuga-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 500 days.

(21) Appl. No.: 13/671,930

(22) Filed: Nov. 8, 2012

(65) Prior Publication Data

US 2013/0120733 A1  May 16, 2013

(30) Foreign Application Priority Data

Nov. 15, 2011  (JP) ................................ 2011-249560

(51) Int. Cl.
| | |
|---|---|
| G01B 11/00 | (2006.01) |
| G01B 11/14 | (2006.01) |
| G03B 27/32 | (2006.01) |
| G03B 27/54 | (2006.01) |
| G03B 27/72 | (2006.01) |
| G03B 27/74 | (2006.01) |
| G03F 9/00 | (2006.01) |

(52) U.S. Cl.
CPC ............ *G03F 9/7046* (2013.01); *G03F 9/7023* (2013.01); *G03F 9/7049* (2013.01); *G03F 9/7065* (2013.01); *G03F 9/7088* (2013.01)

(58) Field of Classification Search
CPC . G03F 7/7025; G03F 7/70775; G03F 9/7015; G03F 9/7019; G03F 9/7023; G03F 9/7026; G03F 9/7046; G03F 9/7049; G03F 9/7065; G03F 9/7088
USPC ............................ 355/18, 67, 68, 71, 72, 77; 356/399–401, 508, 614–616, 620
See application file for complete search history.

(56) References Cited

U.S. PATENT DOCUMENTS

| | | | |
|---|---|---|---|
| 5,850,279 A | 12/1998 | Nara et al. | |
| 5,995,198 A * | 11/1999 | Mizutani | .......................... 355/53 |
| 6,707,533 B2 | 3/2004 | Mishima | |
| 2002/0097386 A1 | 7/2002 | Mishima | |
| 2010/0245848 A1* | 9/2010 | Sakamoto | ..................... 356/620 |

FOREIGN PATENT DOCUMENTS

| | | |
|---|---|---|
| JP | 2-206706 A | 8/1990 |
| JP | 04-321214 A | 11/1992 |
| JP | 05-291111 A | 11/1993 |

(Continued)

*Primary Examiner* — Colin Kreutzer  
(74) *Attorney, Agent, or Firm* — Fitzpatrick, Cella, Harper & Scinto

(57) ABSTRACT

A position measurement apparatus that measures a position of an object using a reference mark includes a first illumination optical system configured to illuminate the object using measurement light from a light source which emits light of a first wavelength band, a second illumination optical system configured to illuminate the reference mark using reference light of a second wavelength band, and a position measurement unit configured to detect light from the object and light from the reference mark and to obtain the position of the object based on the detection result, and the second wavelength band of the reference light is set between an upper limit and a lower limit of the first wavelength band of the measurement light from the light source.

28 Claims, 8 Drawing Sheets

(56) References Cited

FOREIGN PATENT DOCUMENTS

| | | |
|---|---|---|
| JP | 2001-057326 A | 2/2001 |
| JP | 2002-164268 A | 6/2002 |
| JP | 2002-170757 A | 6/2002 |
| JP | 2002-184677 A | 6/2002 |
| JP | 2006-337373 A | 12/2006 |
| KR | 10-0389976 B1 | 5/2004 |

* cited by examiner

POSITION MEASUREMENT APPARATUS AND EXPOSURE APPARATUS WHICH MEASURE POSITION OF OBJECT USING REFERENCE MARK, AND METHOD OF MANUFACTURING DEVICE

BACKGROUND OF THE INVENTION

1. Field of the Invention

The present invention relates to a position measurement apparatus which measures a position of an object such as a mask or a wafer with high accuracy.

2. Description of the Related Art

Recently, a significant progress in a microfabrication technology is seen. When exposure light is changed to short wavelength light such as that from a KrF excimer laser, a glass material that is to be used is limited, and it is difficult to correct a wavelength difference with respect to an alignment wavelength of a projection optical system. Therefore, in an exposure apparatus, adopting an off-axis alignment detection system (an OA detection system) that is not affected by the influence of the wavelength difference is required. In addition, a highly accurate focus system that measures a surface position of a wafer is required.

Conventionally, in a wafer alignment system or a focus system, in order to reduce a position measurement error, a reference optical system is configured so as to perform an absolute value correction measurement. Japanese Patent Laid-Open No. H2-206706 discloses a configuration of including an optical system of measurement reference light separately from an optical system of measuring a wafer in the correction measurement of the wafer alignment system. Japanese Patent Laid-Open No. 2006-337373 discloses a configuration of including an optical system of measurement reference light separately from an optical system of measuring a wafer in the correction measurement of the focus system. In the configuration disclosed in Japanese Patent Laid-Open Nos. H2-206706 and 2006-337373, when the wavelengths of the reference light and the measurement light are different from each other, a wavelength difference is generated in a detection system. Since this wavelength difference causes a position displacement on a sensor, an error is generated in a measurement value. Therefore, in Japanese Patent Laid-Open No. 2002-164268, a configuration of correcting the position displacement caused by such a wavelength difference is disclosed.

A wavelength of the measurement light that is used in a position measurement apparatus is variable, and on the other hand, a wavelength of the reference light is fixed. Therefore, the correction of the measurement value is performed by adding or subtracting a predetermined correction value (an offset value) for an actual measurement value. However, strictly, a correction amount that is required for the actual measurement value is different in accordance with a difference of the wavelength of the measurement light and the wavelength of the reference light. Therefore, considering only a constant correction amount, an exact correction cannot be performed. Furthermore, in an actual position measurement apparatus, in order to improve the ability to handle a manufacturing error of a component part such as an optical part or an assembly error, a use wavelength band tends to be widened.

SUMMARY OF THE INVENTION

The present invention provides a position measurement apparatus and an exposure apparatus that reduce a measurement error caused by a wavelength difference so as to perform highly accurate position measurement, and a method of manufacturing a device.

A position measurement apparatus as one aspect of the present invention measures a position of an object using a reference mark, and the position measurement apparatus includes a first illumination optical system configured to illuminate the object using measurement light from a light source which emits light of a first wavelength band, a second illumination optical system configured to illuminate the reference mark using reference light of a second wavelength band, and a position measurement unit configured to detect light from the object and light from the reference mark and to obtain the position of the object based on the detection result. The second wavelength band of the reference light is set between an upper limit and a lower limit of the first wavelength band of the measurement light from the light source.

A position measurement apparatus as another aspect of the present invention measures a position of an object using a reference mark, and the position measurement apparatus includes a first illumination optical system configured to illuminate the object using measurement light, a second illumination optical system configured to illuminate the reference mark using reference light, wavelength band of the reference light being different from wavelength band of the measurement light, and a position measurement unit configured to detect light from the object and light from the reference mark and to obtain the position of the object based on the detection result. The position measurement unit previously stores a variation amount of a reference mark measurement value that is generated by difference between the wavelength band of the measurement light and the second wavelength band of the reference light based on a result which is obtained by measuring the reference mark using the measurement light and a result which is obtained by measuring the reference mark using the reference light and corrects a measurement result by the position measurement unit using the variation amount of the reference mark measurement value.

An exposure apparatus as another aspect of the present invention exposes a pattern of a mask onto a substrate, and the exposure apparatus includes the position measurement apparatus.

A method of manufacturing a device includes exposing a substrate using an exposure apparatus, and developing the exposed substrate. The exposure apparatus exposes a pattern of a mask onto the substrate, the exposure apparatus comprises a position measurement apparatus, the position measurement apparatus includes a first illumination optical system configured to illuminate the object using measurement light from a light source which emits light of a first wavelength band, a second illumination optical system configured to illuminate the reference mark using reference light of a second wavelength band, and a position measurement unit configured to detect light from the object and light from the reference mark and to obtain the position of the object based on the detection result, and the second wavelength band of the reference light is set between an upper limit and a lower limit of the first wavelength band of the measurement light from the light source.

Further features and aspects of the present invention will become apparent from the following description of exemplary embodiments with reference to the attached drawings.

DESCRIPTION OF THE PREFERRED EMBODIMENTS

Figure 1:
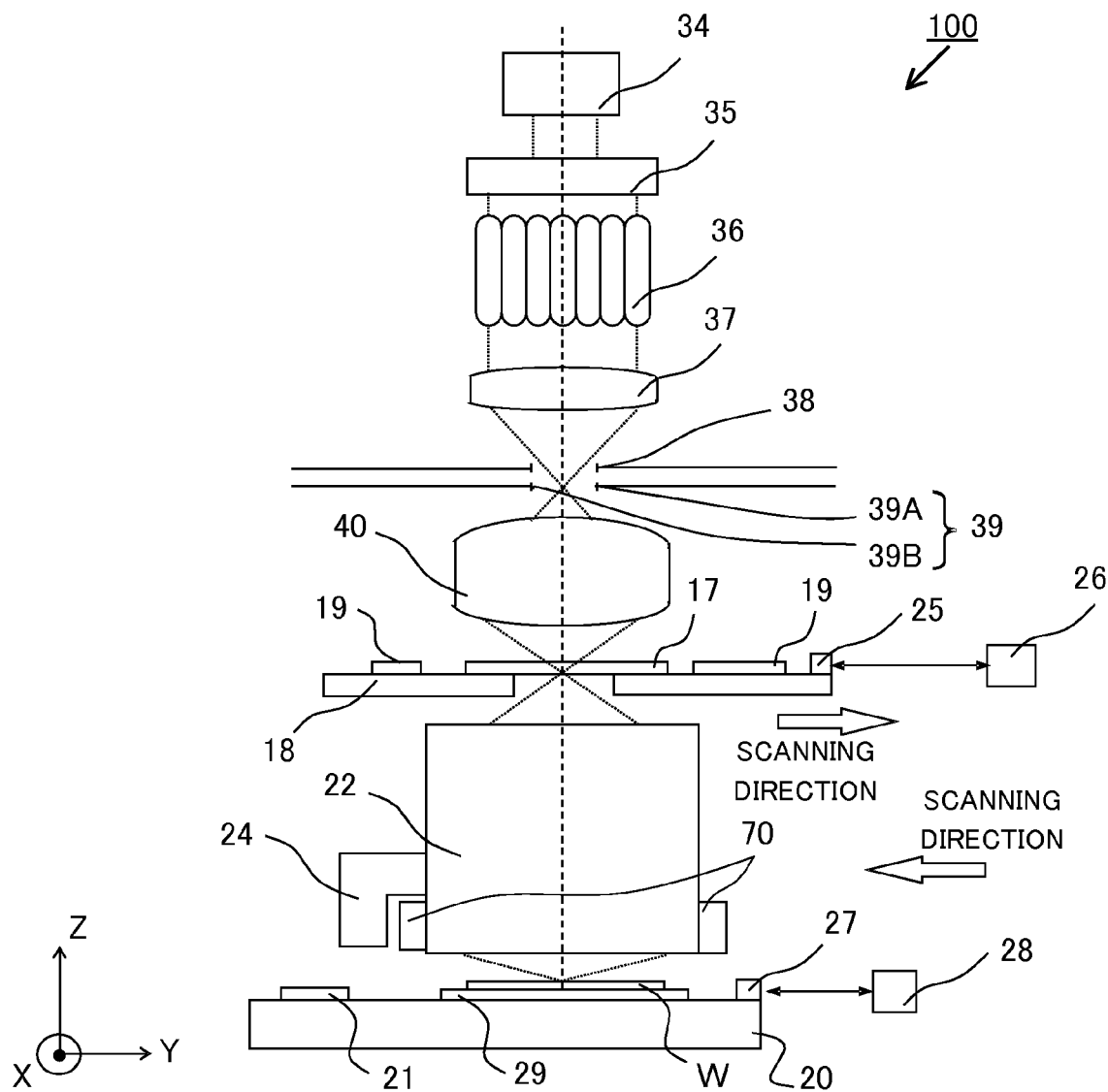
FIG. 1 is a schematic diagram of an exposure apparatus that includes a position measurement apparatus in each of the present embodiments.

Exemplary embodiments of the present invention will be described below with reference to the accompanied drawings. In each of the drawings, the same elements will be denoted by the same reference numerals and the duplicate descriptions thereof will be omitted.

FIG. 1 is a schematic diagram of an exposure apparatus 100 in the present embodiment. The exposure apparatus 100 is, as described below, configured by including an OA detection system 24 and a focus measurement apparatus 70 as a position measurement apparatus. The position measurement apparatus of the present embodiment is configured so as to detect a position of an object (an object to be detected) using a reference mark. The reference mark only needs to have a function as a reference index, and the configuration or the position of the reference mark is not limited. The object is not limited to a wafer (a wafer mark), and the present embodiment can also be applied to a case where another object is to be detected.

The exposure apparatus 100 projects a pattern of a mask 17 (an original plate) on a wafer W (a substrate) via a projection optical system 22. Illumination light having a predetermined wavelength band is emitted from a light source 34. The illumination light emitted from the light source 34 enters an illumination optical system that illuminates the mask 17. The illumination optical system is configured by including an illumination light shaping optical system 35, a fly-eye lens 36, a condenser lens 37, a fixed field stop 38, a variable field stop 39 (a movable blind), and a relay lens system 40. The variable field stop 39 includes two blades (light shielding plates 39A and 39B) that define a width in a scanning direction (±Y directions), and two blades (not shown) that define a width in a non-scanning direction (±X directions) perpendicular to the scanning direction.

In such a configuration, a circuit pattern image of the mask 17 in a slit-shaped illumination range is transferred onto the wafer W via the projection optical system 22. As the light source 34, for example, a pulse light source of a high-frequency generation apparatus of an excimer laser light source such as an ArF excimer laser or a KrF excimer laser, a metal vapor laser light source, or a YAG laser, a continuum light source such as a configuration of a combination of a mercury lamp and an ellipsoidal reflection mirror, or the like is used.

When the light source 34 is the pulse light source, the on/off of the exposure is switched by a control of a supplied electric power from a power-supply apparatus used for a pulse light source. On the other hand, when the light source 34 is the continuum light source, the on/off is switched by a shutter in the illumination light shaping optical system 35. However, since the variable field stop 39 is provided in the present embodiment, the on/off of the exposure may also be switched by opening or closing the variable field stop 39. The illumination light from the light source 34 is set so that a diameter of the light beam is a predetermined size by the illumination light shaping optical system 35, and reaches the fly-eye lens 36. A lot of secondary light sources are formed on an emitting surface of the fly-eye lens 36. The illumination lights from these secondary light sources are collected by the condenser lens 37, and then reach the variable field stop 39 via the fixed field stop 38.

In the present embodiment, the fixed field stop 38 is disposed at a side of the condenser lens 37 relative to the variable field stop 39, but on the contrary, the fixed field stop 38 may also be disposed at a side of the relay lens system 40. A rectangular slit-shaped opening is formed on the fixed field stop 38. Therefore, the light beam passing through the fixed field stop 38 becomes a light beam having a rectangular slit-shaped cross section, and enters the relay lens system 40. A longitudinal direction of the slit is a direction perpendicular to a paper plane in FIG. 1. The relay lens system 40 is a lens system that sets the variable field stop 39 and a pattern forming surface of the mask 17 so as to be conjugate to each other.

The mask 17 is held on a mask stage 18. The mask stage 18 is configured so as to be able to move the mask 17 in the scanning direction (±Y directions). A position of the mask stage 18 is measured by an interferometer 26 that detects reflected light from a reflection mirror 25 provided on the mask stage 18. A mask reference mark 19 is provided on the mask stage 18, which is used for performing position measurement of the mask stage 18.

The wafer W is placed on a stage platen 29 of a wafer stage 20 by a wafer carrier apparatus (not shown). The wafer stage 20 performs a positioning (an alignment) of the wafer W in a plane perpendicular to an optical axis of the projection optical system 22, and is also configured by including an XY stage that scans the wafer W in the scanning direction (±Y directions), a Z stage that performs a positioning (an alignment) of the wafer W in a Z direction, and the like. The position of the wafer stage 20 is measured by an interferometer 28 that detects reflected light from a reflection mirror 27 formed on the wafer stage 20. A stage reference mark 21 is provided on the wafer stage 20, which is used for performing position measurement of the wafer stage 20. An off-axis type OA detection system 24 (an off-axis alignment detection system) is provided above the wafer W. A focus measurement apparatus 70 that measures a position of the projection optical system 22 in a focus direction (±Z directions) is provided in an exposure region of the projection optical system 22.

Figure 2A:
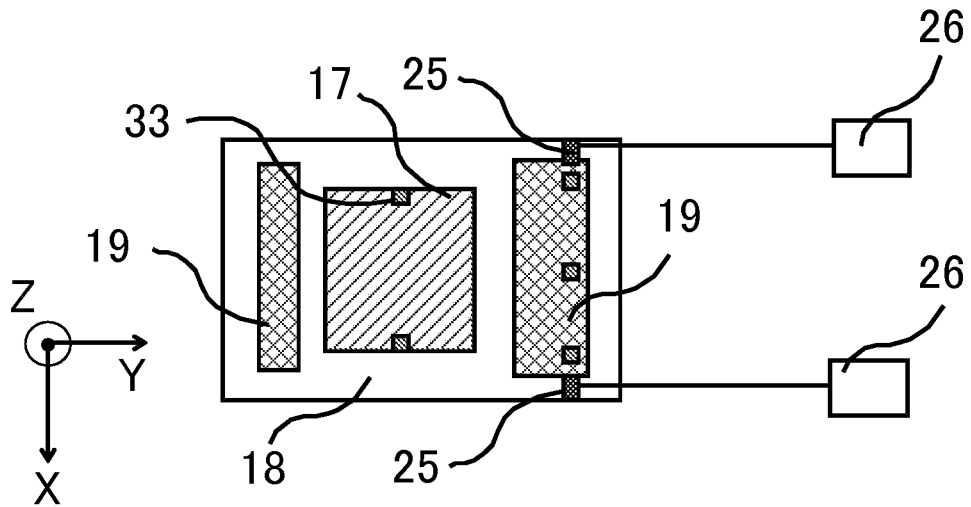
FIGS. 2A and 2B are configuration diagrams of a peripheral part of a mask stage in each of the present embodiments.
Figure 2B:
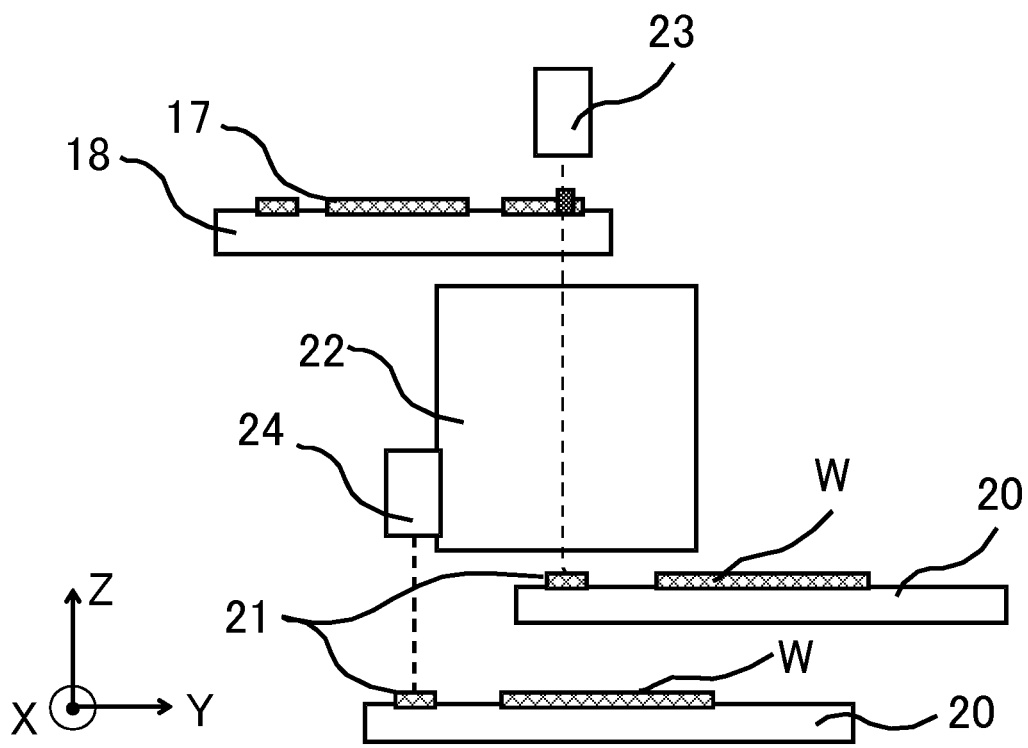

Next, referring to FIGS. 2A and 2B, a method of measuring a baseline will be described. FIGS. 2A and 2B are configuration diagrams of a peripheral part of the mask stage in the present embodiment, and FIGS. 2A and 2B illustrates a top view and a cross-sectional view, respectively. The mask stage 18 is configured to hold the mask 17 to be movable. The mask 17 is placed on the mask stage 18. The mask 17 is provided with a baseline measurement mark 33. A mask reference mark 19 that is a reference mark for aligning the mask 17 and the mask stage 18 is provided on the mask stage 18. The mask 17 uses a mask alignment microscope (not shown) to be aligned with the mask reference mark 19.

First of all, as illustrated in FIG. 2B, using the alignment microscope 23, a relative position between the baseline measurement mark 33 that is provided on the mask 17 and the stage reference mark 21 that is fixed on the wafer stage 20 via the projection optical system 22 is detected (a first step). After the first step is completed, the wafer stage 20 is moved and the stage reference mark 21 is moved to an observation region of the OA detection system 24. Subsequently, a relative position between the stage reference mark 21 and the reference mark of the OA detection system 24 is detected (a second step). A baseline amount is calculated based on a detection result of the first step and the second step. As a result, the measurement position of the OA detection system 24 with respect to a center of a pattern exposure can be obtained. Then, the exposure can be started after aligning the wafer W (the substrate).

[Embodiment 1]

Figure 3:
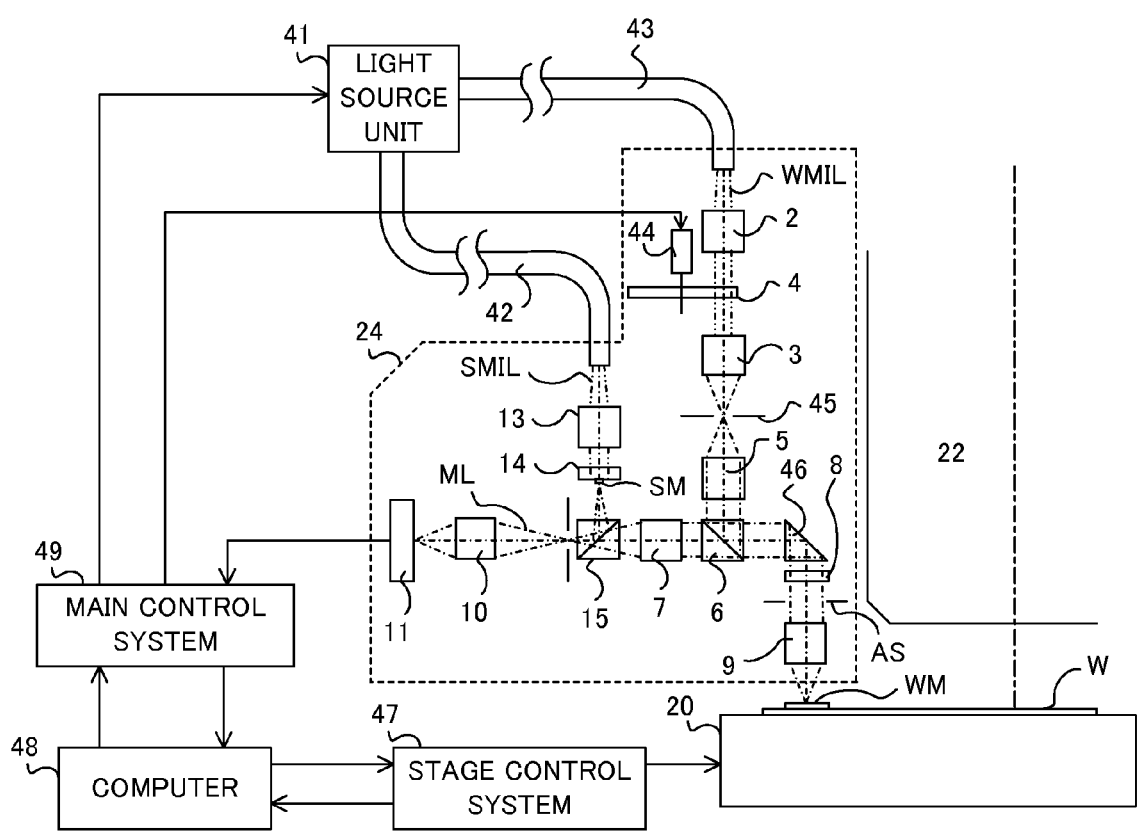
FIG. 3 is a configuration diagram of main part of an exposure apparatus in Embodiment 1.

Next, an exposure apparatus that includes the position measurement apparatus in the embodiment of the present invention will be described. FIG. 3 is a configuration diagram of a main part of the exposure apparatus in the present embodiment, which illustrates the OA detection system 24 (the position measurement apparatus) as a center.

In FIG. 3, reference numeral 22 denotes a projection optical system. Reference numeral 41 denotes a light source unit. Since the light source unit 41 is provided with a heating element (a light source) such as a HeNe laser or a halogen lamp, it is disposed away from the OA detection system 24 that requires temperature stability. A wafer mark illumination light beam WMIL of the OA detection system 24 is introduced from the light source unit 41 by a fiber 43 that is connected with the illumination system of the OA detection system 24. The wafer mark illumination light beam WMIL from an emitting end of the fiber 43 passes any one of various kinds of illumination aperture stops that are arranged on an illumination aperture stop disk 4 via illumination relay lenses 2 and 3. These illumination aperture stops are configured to be switchable by a rotation method (a turret method) by moving the illumination aperture stop disk 4 using a motor 44.

When an illumination condition of the combination of the kind of the light source unit 41 (the HeNe laser, the halogen lamp, or the like) and the illumination aperture stop (hereinafter, referred to as an "illumination mode") is set, a computer 48 commands a rotation amount from an origin of the motor 44 to a main control system 49. As described below, the computer 48 is a position measurement unit that detects a position of a wafer mark WM based on a light beam detected by a detection optical system 10. The rotation origin of the motor 44 can be obtained by previously rotating the motor 44 as an origin detection drive. In an origin detection method of the present embodiment, the rotation origin of the motor 44 is set at a position where a slit provided on the illumination aperture stop disk 4 passes a detector of a photo switch. The main control system 49 drives the motor 44 in accordance with the rotation amount that is commanded by the computer 48, and any one of the illumination aperture stops is set to a position of the wafer mark illumination light beam WMIL.

Next, the wafer mark illumination light beam WMIL illuminates an illumination field stop 45 via the illumination relay lens 3. The wafer mark illumination light beam WMIL emitted from the illumination field stop 45 transmits through an illumination optical system 5 (a first illumination optical system), and then enters a polarizing beam splitter 6. The illumination optical system 5 is configured so as to illuminate the object (the wafer mark WM) using measurement light that has a first wavelength band. The wafer mark illumination light beam WMIL has a P-polarized component (a component that is parallel to a paper plane) that is reflected by the polarizing beam splitter 6. The polarized beam splitter 6 is used to detect detection light with high efficiency, and it may also be configured by a normal half mirror if a light amount is sufficient.

The wafer mark illumination light beam WMIL that transmits through the polarizing beam splitter 6 is reflected on a reflection prism 46, and proceeds to the wafer W (in a downward direction in the drawing). A quarter wave plate 8 is disposed under the reflection prism 46. The wafer mark illumination light beam WMIL that transmits through the quarter wave plate 8 is converted into circular polarized light. Then, An epi-illumination is performed for the wafer mark WM that is an object on the wafer W via an imaging aperture stop AS and an objective lens 9. In this case, the wafer W is held on a wafer stage 20 that can drive in X, Y, and Z directions and rotation directions of respective axes. The wafer stage 20 is configured to be able to be driven by a stage control system 47 in accordance with a command from the computer 48.

Imaging light beam ML that is generated by reflection, diffraction, and scattering from the wafer mark WM transmits through the objective lens 9, the imaging aperture stop AS, and the quarter wave plate 8. The imaging light beam ML transmitting through the quarter wave plate 8 is converted into linear polarized light (S-polarized light) in a direction perpendicular to the paper plane (in the W direction) from the circular polarized light. Next, the imaging light beam ML transmits through the polarizing beam splitter 6 via the reflection prism 46, and it is introduced to a relay lens 7. The relay lens 7 forms an image of the wafer mark WM once. Then, it is imaged by on a light receiving surface of an image sensor 11 by the detection optical system 10 again. The detection optical system 10 detects the light beam from the wafer mark WM (and a light beam from a reference mark SM described below). A wafer mark signal detected by the image sensor 11 is inputted to the computer 48 via the main control system 49. A reference mark illumination light beam SMIL of the OA detection system 24 is introduced by a fiber 42 that connects the light source unit 41 with a reference mark illumination system of the OA detection system 24. The reference mark illumination light beam SMIL from an emitting end of the fiber 42 performs Kohler illumination so as to obtain a uniform distribution of the light amount on a reference plate 14 via a reference plate illumination optical system 13 (a second illumination optical system). The reference plate illumination optical system 13 is configured so as to illuminate the reference mark SM using reference light that has a second wavelength band.

In the present embodiment, the second wavelength band of the reference light is set between an upper limit and a lower limit of the first wavelength band of the measurement light. When the relationship between the first wavelength band and the second wavelength band is set as described above, a measurement error that is caused by a wavelength difference can be reduced since the wavelength difference between the reference light and the measurement light is decreased.

Alternatively, the embodiment may also be configured so as to perform a correction based on the wavelength difference between the first wavelength band and the second wavelength band. In this case, a variation amount of a reference mark measurement value that is generated due to the difference between the first wavelength band and the second wavelength band is previously stored based on a result of measuring the reference mark SM using the measurement light and a result of measuring the reference mark SM using the reference light. For example, this variation amount is stored in a storage unit that is provided in the computer 48. The computer 48 corrects the measurement result of the wafer mark WM by the measurement light using the variation amount of the reference mark measurement value. Also in such a configuration, the measurement error caused by the wavelength difference can be reduced.

The reference mark SM is provided on the reference plate 14, and only the light transmitting through the reference mark SM is introduced to a half mirror 15 (an optical element). The half mirror 15 introduces the light beam from the reference mark SM into the image sensor 11. The image sensor 11 receives a light beam combined by the half mirror 15, i.e., combined light of the light beam from the wafer mark WM and the light beam from the reference mark SM, via the detection optical system. A reference mark SM signal that is detected by the image sensor 11 is inputted to the computer 48 via the main control system 49. The computer 48 uses the wafer mark signal and the reference mark signal to calculate a position of the wafer W based on a position of the wafer stage 20. The stage control system 47 drives the wafer stage 20 based on the calculation result so as to align the wafer W.

Figure 4:
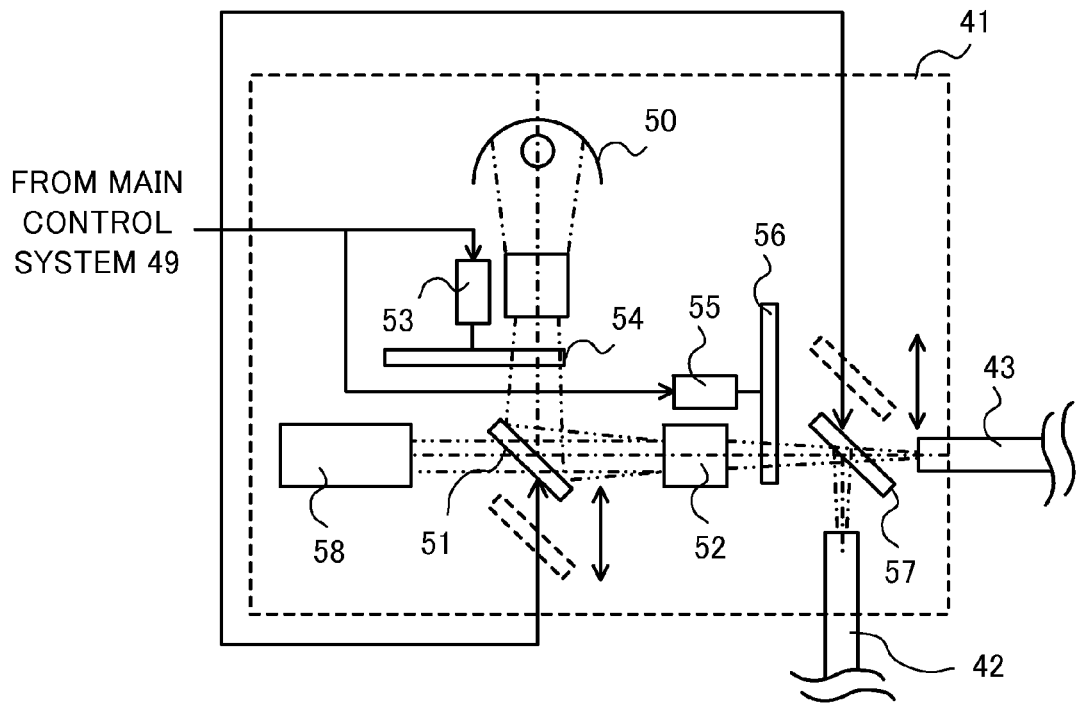
FIG. 4 is a configuration diagram of a light source unit in Embodiment 1.

Next, referring to FIG. 4, the light source unit 41 in a position measurement apparatus of the present embodiment will be described. FIG. 4 is a configuration diagram of the light source unit 41. The light source unit 41 is provided with a halogen lamp 50, a HeNe laser 58, a light source switching mirror 51, an optical system 52 that collects light beams from light sources, i.e. the halogen lamp 50 and the HeNe laser 58, to incident ends of the fibers 42 and 43, and an optical path switching mirror 57 (an optical path switching unit). The halogen lamp 50 and the HeNe laser 58 are a first light source that illuminates the wafer mark WM and a second light source that illuminates the reference mark SM, respectively. In the present embodiment, one light source unit 41 is configured by commonly using the first light source and the second light source. The first light source and the second light source may also be reversed each other. Each of the first light source and the second light source only needs to have at least one of a halogen lamp, an LED, a laser, and a laser diode.

The light source unit 41 is provided with a wavelength switching disk 54 that changes the light from the halogen lamp 50 to a desired wavelength band and a motor that drives the wavelength switching disk 54. In addition, the light source unit 41 is provided a light amount adjusting disk 56 that performs a light amount adjustment of the light source and a motor 55 that drives the light amount adjusting disk 56. The wavelength switching disk 54 is provided with a plurality of wavelength cut filters, and the wavelength switching disk 54 is driven by a motor 53 to be able to switch the wavelength by the rotation method (the turret method).

The wavelength switching disk 54 of the present embodiment has a mechanism that can realize a desired wavelength of the wavelength band by combining the wavelength cut filters at a long wavelength side and a short wavelength side. First of all, wavelength bands (illumination wavelength bands) that are used in the present embodiment are set to be "a" (450 nm to 550 nm), "b" (550 nm to 600 nm), "c" (600 nm to 650 nm), "d" (650 nm to 700 nm), and "e" (700 nm to 800 nm). Furthermore, the wavelength (the wavelength band) of the HeNe laser is set to be 630 nm. A minimum unit of the wavelength is 1 nm.

Table 1 indicates the combination of each wavelength band and the wavelength cut filters that correspond to the wavelength band.

TABLE 1

| WAVELENGTH BAND | SHORT WAVELENGTH SIDE CUT FILTER | LONG WAVELENGTH SIDE CUT FILTER |
|---|---|---|
| a | 450 nm-550 nm | NOT MORE THAN 449 nm | NOT LESS THAN 551 nm |
| b | 550 nm-600 nm | NOT MORE THAN 549 nm | NOT LESS THAN 601 nm |
| c | 600 nm-650 nm | NOT MORE THAN 599 nm | NOT LESS THAN 651 nm |
| d | 650 nm-700 nm | NOT MORE THAN 649 nm | NOT LESS THAN 651 nm |
| e | 700 nm-800 nm | NOT MORE THAN 699 nm | NOT LESS THAN 801 nm |

(*MINIMUM UNIT IS SET TO 1 nm)

In the embodiment, for example, a case where the wavelength band "a" (450 nm to 550 nm) is selected is considered. In this case, when the short wavelength side cut filter that cuts the wavelength not more than 449 nm and the long wavelength side cut filter that cuts the wavelength not less than 551 nm are combined, the light from the halogen lamp 50 can be generated as illumination light in a desired wavelength band. Also for another wavelength band, adopting the similar combination, illumination light having a desired wavelength band can be generated.

Figures 5A, 5B:
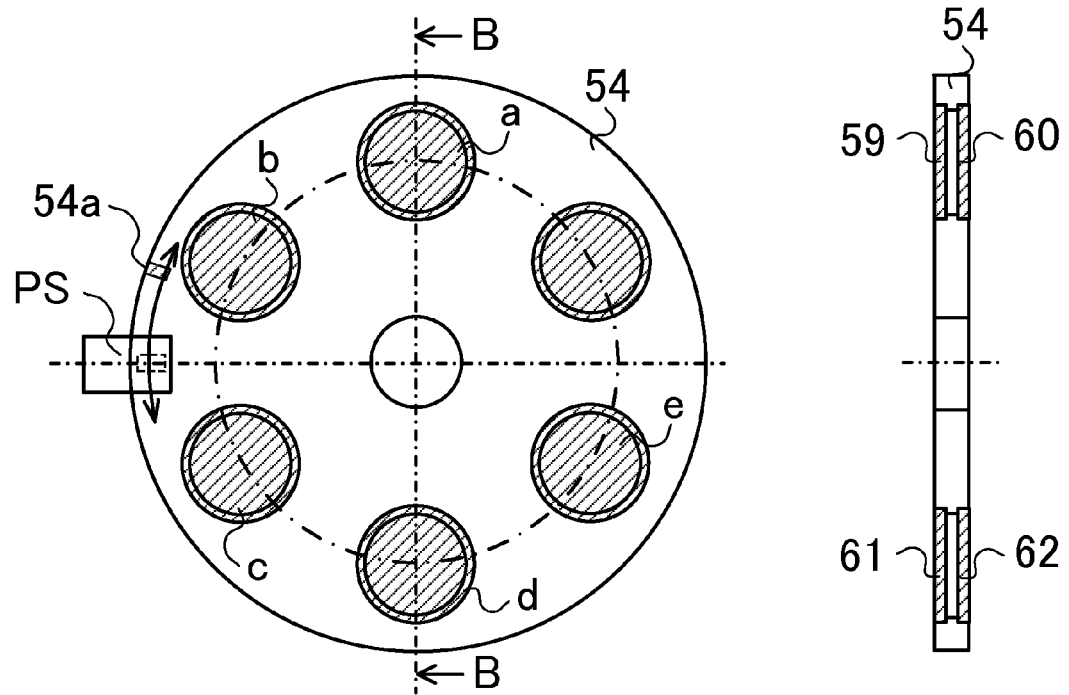
FIGS. 5A and 5B are configuration diagrams of a wavelength switching disk in Embodiment 1.

FIGS. 5A and 5B are configuration diagrams of the wavelength switching disk 54 in the present embodiment, and FIG. 5A illustrates a plan view and FIG. 5B illustrates a cross-sectional view which is cut along B-B line of FIG. 5A. The wavelength switching disk 54 includes a plurality of cut filters that are combined so as to correspond to the plurality of wavelength bands. As illustrated in the cross-sectional view of FIG. 5B, short wavelength side cut filters 59 and 61 are disposed at one surface side of the wavelength switching disk 54, and long wavelength side cut filters 60 and 62 are disposed on the other surface side of the wavelength switching disk 54. Thus, when the plurality of the short wavelength side cut filters and the long wavelength side cut filters are combined, the illumination light having a desired wavelength band can be generated. In the present embodiment, for the wavelength band "a", the wavelength cut filter which cuts a wavelength not more than 449 nm is used as the short wavelength side cut filter 59, and the wavelength cut filter which cuts a wavelength not less than 551 nm is used as the long wavelength side cut filter 60. Similarly, for the wavelength band "d", the wavelength cut filter which cuts a wavelength not more than 649 nm is used as the short wavelength side cut filter 61, and the wavelength cut filter which cuts a wavelength not less than 701 nm is used as the long wavelength side cut filter 62.

When the wavelength band of the illumination light is set, the computer 48 commands a rotation amount with respect to a rotation origin of the motor 55 to the main control system 49. The rotation origin of the motor 55 is previously obtained by rotating the motor 55 as an origin detection drive. In the origin detection method of the present embodiment, the rotation origin of the motor 55 is set to a position where a slit 54a that is provided on the wavelength switching disk 54 passes the detector of the photo switch PS. The main control system 49 drives the motor 44 in accordance with the commanded rotation amount, and any one of the illumination aperture stops is set to be the position of the wafer mark illumination light beam WMIL. In the present embodiment, five kinds of wavelength bands "a" to "e" are set, but the number of the kinds of wavelength bands is not limited to this and the number other than five may also be set. The wavelength switching disk 54 has a step configuration, but the embodiment is not limited to this, and a configuration of a plurality of steps may also be adopted to be able to generate the illumination lights having more wavelength bands. The wavelength band of the reference light is selected so as to be linked with the selection of the wavelength band of the measurement light.

In FIG. 4, the light amount adjusting disk 56 is provided with a plurality of ND filters which have transmittance different from each other. Driving the light amount adjusting disk 56 using the motor 55, the ND filter is configured to be switchable by the rotation method (the turret method). The light amount adjustments of the reference light and the measurement light can be performed independently of each other by the light amount adjusting disk 56. An optical path of the light passing through the light amount adjusting disk 56 is switched by an optical path switching mirror 57 that collects the light to the incident ends of the fibers 42 and 43. Thus, the optical path switching mirror 57 switches the optical path of the light illuminating the wafer mark WM and the optical path of the light illuminating the reference mark SM.

When the computer 48 commands the main control system 49 to use any one of the light sources of the HeNe laser 58 and the halogen lamp 50, the main control system 49 drives a light source switching mirror 51 in accordance with the command. In other words, when the HeNe laser 58 is selected as a light source, the light source switching mirror 51 is removed from the optical path (is moved in a downward direction) as indicated by a dash line in FIG. 4, and the light beam from the HeNe laser 58 is collected on the incident end of the fiber via the optical system 52. On the other hand, when the halogen lamp 50 is selected as a light source, the light beam from the halogen lamp 50 is reflected by the light source switching mirror 51, and it is collected on the incident end of the fiber via the optical system 52. In the present embodiment, the arrangement of the HeNe laser 58 and the halogen lamp 50 may also be reversed each other.

When any one of the wavelengths "a" to "e" is selected, the computer 48 commands the main control system 49 to be set to the selected wavelength band so that the wavelength switching disk 54 is driven by the motor 53. Similarly, also for the light amount adjustment, the computer 48 commands the main control system 49 to be the set light amount so that the light amount adjusting disk 56 is driven by the motor 55. In accordance with a command that determines which of the wafer mark WM and the reference mark SM is to be measured, which is outputted from the computer 48 to the main control system 49, the optical path switching mirror 57 is driven by the main control system 49. In other words, when the measurement of the wafer mark WM is selected, the optical path switching mirror 57 is removed from the optical path, i.e., is moved in an upward direction, as indicated by a dashed line in FIG. 4, and the light beam is collected on the incident end of the fiber 43 that illuminates the wafer mark WM. On the other hand, when the measurement of the reference mark SM is selected, the light beam is reflected by the optical path switching mirror 57 and is collected on the incident end of the fiber 42 that illuminates the reference mark SM. In the present embodiment, the incident end of the fiber 43 and the incident end of the fiber 42 may also be reversed each other. In the measurements of the wafer mark WM and the reference mark SM in which the influence of manufacturing processes are received, light amount values may also be set to be different from each other. A storage time of the image sensor 11 may also be changed.

Figure 6A:
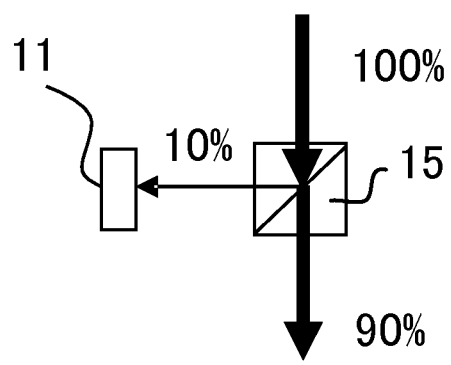
FIGS. 6A and 6B are diagrams of describing characteristics of a half mirror in Embodiment 1.
Figure 6B:
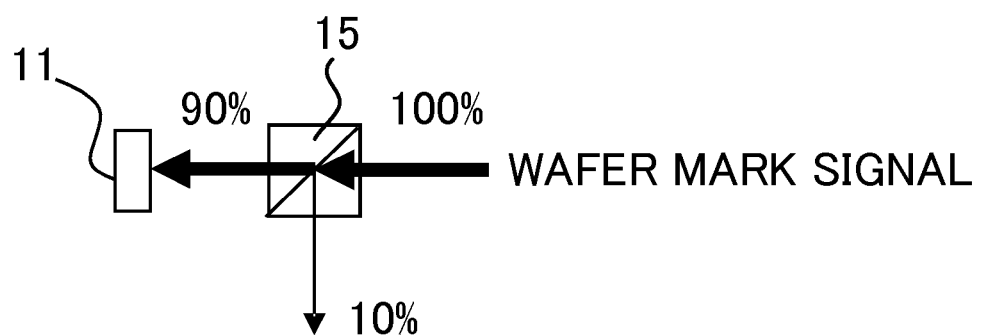

The half mirror 15 illustrated in FIG. 3 is not limited to a half mirror, and its characteristics such as transmittance or reflectance can be arbitrarily changed. FIGS. 6A and 6B are diagrams of the characteristics of the half mirror on conditions that a film of the half mirror 15 has optical characteristics of transmittance of 90% and reflectance of 10%. FIG. 6A illustrates transmissive characteristics and reflective characteristics when the light of 100% of the reference mark signal enters the half mirror 15. The light of 90% of the reference mark signal transmits through the half mirror 15 and the light of 10% of the reference mark signal is reflected by the half mirror 15 so as to enter the image sensor 11. FIG. 6B illustrates transmissive characteristics and reflective characteristics when the light of 100% of the wafer mark signal enters the half mirror 15. The light of 10% of the wafer mark signal is reflected by the half mirror 15 and the light of 90% of the wafer mark signal transmits through the half mirror 15 so as to enter the image sensor 11. Thus, in the present embodiment, the optical characteristics of the film of the half mirror 15 is set so that the light amount of the light beam from the wafer mark WM is larger than the light amount of the light beam from the reference mark SM. Differentiating the transmittance from the reflectance, a larger light amount of the wafer mark signal can be obtained relative to the light amount of the reference mark signal.

[Embodiment 2]

Figure 7:
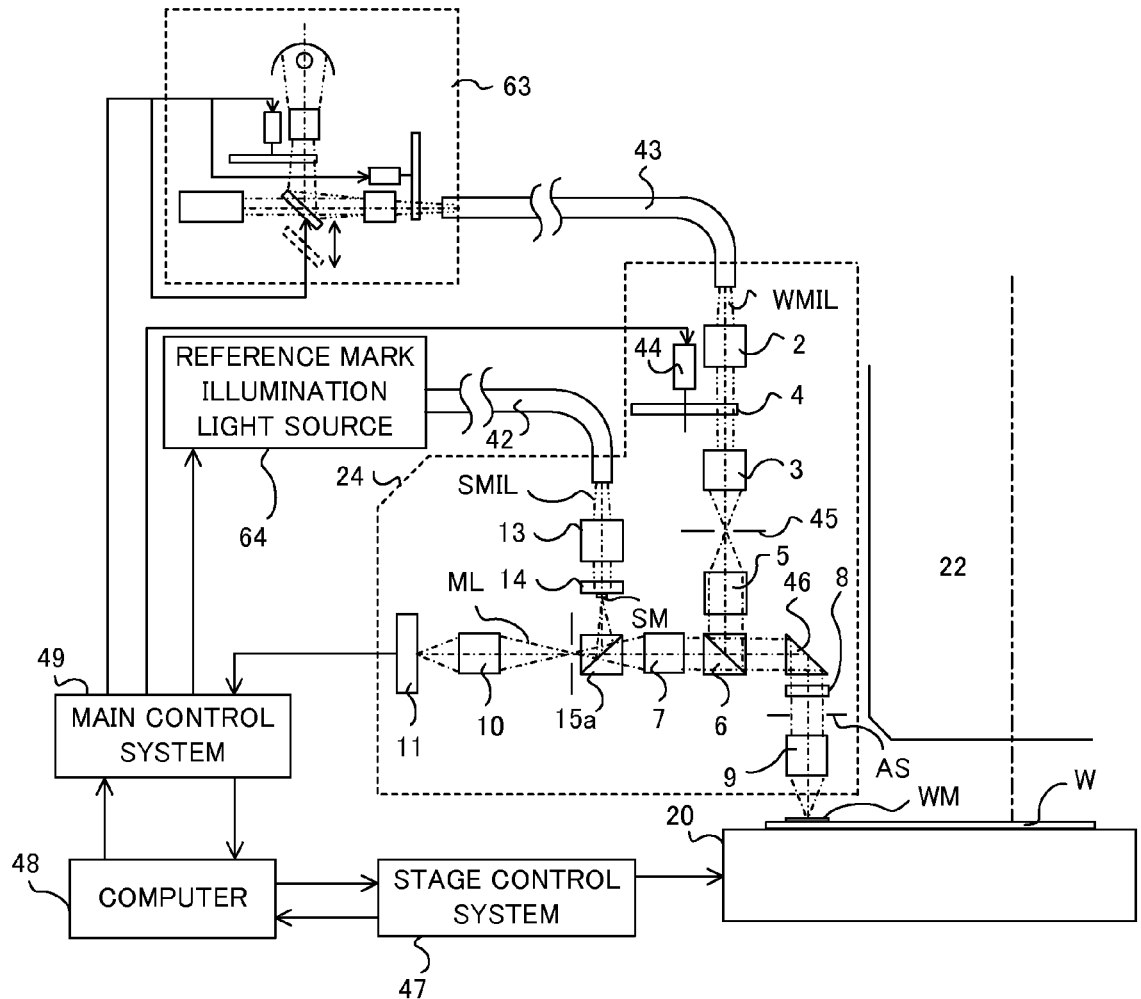
FIG. 7 is a configuration diagram of a main part of an exposure apparatus in Embodiment 2.

Next, referring to FIG. 7, Embodiment 2 of the present invention will be described. FIG. 7 is a configuration diagram of a main part of an exposure apparatus in the present embodiment. The exposure apparatus of the present embodiment is configured so that a light source 63 (a wafer mark illumination light source) that illuminates the wafer mark WM and a light source 64 (a reference mark illumination light source) that illuminates the reference mark SM are separated from each other. The OA detection system 24 has a configuration similar to that of Embodiment 1. Both the light sources 63 and 64 are disposed away from the OA detection system 24 that requires temperature stability. In addition, both the light sources 63 and 64 are connected with the OA detection system 24 using the fibers 42 and 43 independently of each other.

In the present embodiment, each of the illumination light sources that emits wafer alignment light is configured as a dedicated light source. Therefore, differently from Embodiment 1, it is not necessary to provide an optical path switching unit that switches the fiber 43 which is used to illuminate a light beam onto the wafer mark WM and the fiber 42 which is used to illuminate a light beam onto the reference mark SM.

In the measurements of the wafer mark WM and the reference mark SM, in order to perform the measurements using illumination lights with the same wavelength, the configuration of the light source 64 that illuminates the reference mark SM only needs to be a light source that emits the wafer alignment light. The computer 48 commands a selected wavelength and a measurement timing to the main control system 49, and the main control system 49 performs the measurements selectively using the light source 63 that is used to illuminate the wafer mark WM and the light source 64 that is used to illuminate the reference mark SM based on the command.

Figure 8A:
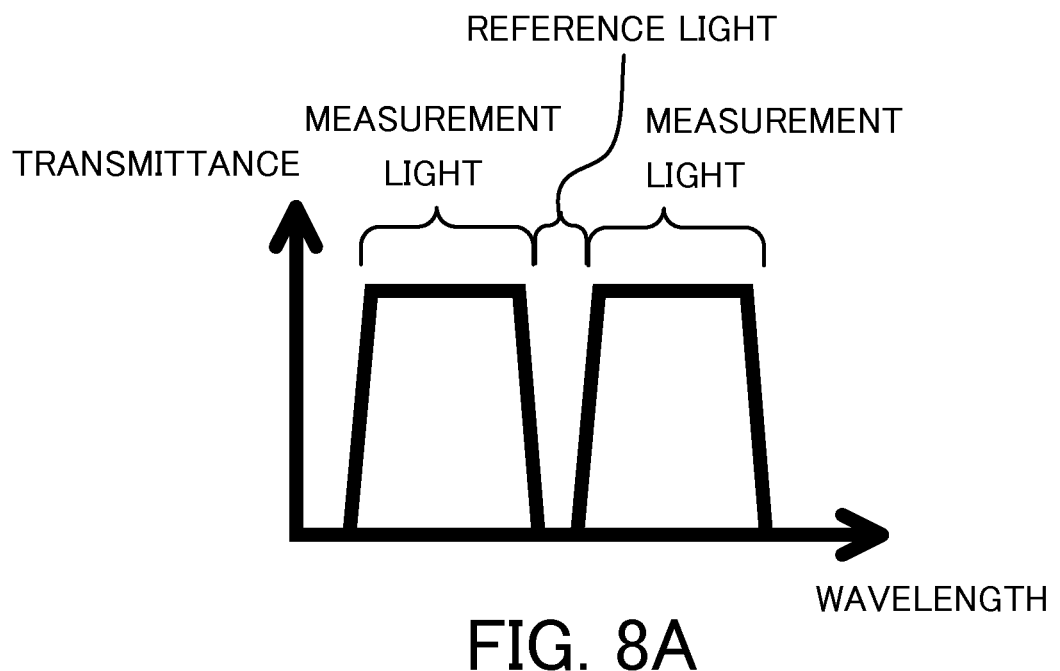
FIGS. 8A and 8B are diagrams of describing characteristics of a dichroic mirror in Embodiment 2.
Figure 8B:
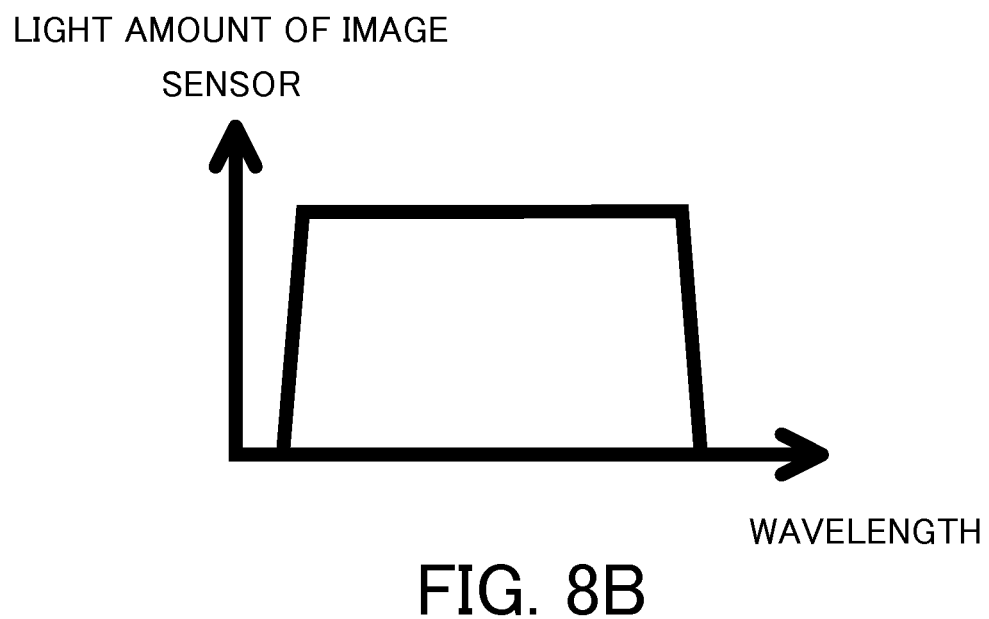

The exposure apparatus (the position measurement apparatus) of Embodiment 1 uses the half mirror 15, and on the other hand, the present embodiment uses a dichroic mirror 15a instead of the half mirror 15. FIGS. 8A and 8B are diagrams of describing a case where the dichroic mirror 15a is used, i.e. characteristics of the dichroic mirror 15a. FIG. 8A illustrates a relationship between the transmittance of the mirror and the wavelength. FIG. 8B illustrates a relationship between a light amount on the image sensor 11 and the wavelength. As illustrated in FIG. 8A, a film that does not have partially transmissive characteristics near the center of the wavelength band of the wafer mark measurement light is adopted, and the reference mark measurement wavelength is set within the wavelength band. Thus, the optical characteristics of the film of the dichroic mirror 15a (an optical element) are different from each other between the measurement light having a first wavelength band and the reference light having a second wavelength band.

The present embodiment, as illustrated in FIG. 8B, can perform the measurement using the image sensor 11 in all measurement wavelengths. As a result, setting the reference mark measurement wavelength near the center of the wavelength band of the wafer mark measurement light, a system that reduces a measurement error caused by the wavelength difference can be configured. In the present embodiment, the half mirror 15 of Embodiment 1 may also be used.

[Embodiment 3]

Next, referring to FIG. 9, Embodiment 3 of the present invention will be described. In Embodiment 2, the light source 64 which measures the reference mark SM has the configuration similar to that of the light source 63 which measures the wafer mark WM. In other words, each of the light sources 63 and 64 includes the HeNe laser 58 and the halogen lamp 50, and the illumination lights having a plurality of wavelength bands can be generated. However, the light source is not limited to such a configuration, and the light source, for example, can also be configured by including a plurality of LEDs each having a specific wavelength band.

Figure 9:
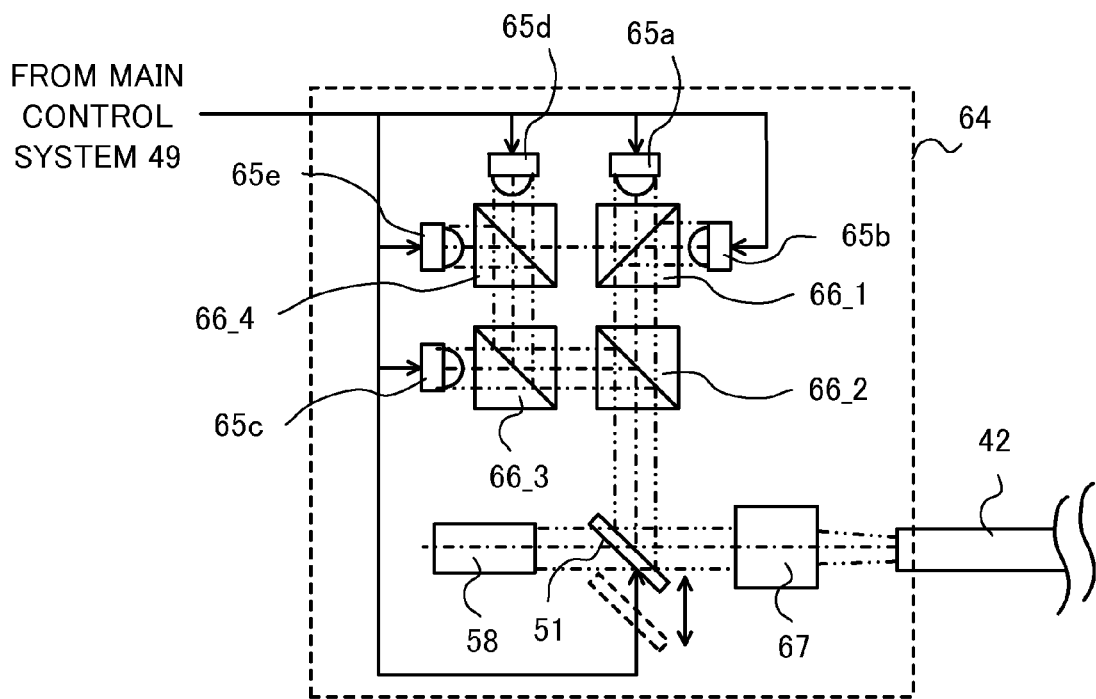
FIG. 9 is a configuration diagram of a light source unit in Embodiment 3.

FIG. 9 is a configuration diagram of the light source 64 in the present embodiment, which illustrates the reference mark light source (the light source 64) that is configured by using five LEDs. In FIG. 9, reference numerals 65a, 65b, 65c, 65d, and 65e denote LEDs that have wavelength bands "a", "b", "c", "d", and"e", respectively. For example, a white LED may be used for the wavelength band "a" that has a comparatively short wavelength band.

Reference numerals 66_1 to 66_4 denote dichroic mirrors. In the present embodiment, four kinds of dichroic mirrors are provided in accordance with the wavelength band. The film of each dichroic mirror is different from each other in accordance with the relation of the arrangements of the LEDs each having any one of the wavelength bands "a" to "e". The dichroic mirror 66_1 has wavelength characteristics of reflecting the light which has the wavelength band not less than 551 nm and transmitting the light which has the wavelength band not more than 549 nm. The dichroic mirror 66_2 has wavelength characteristics of reflecting the light which has the wavelength band not less than 601 nm and transmitting the light which has the wavelength band not more than 600 nm. The dichroic mirror 66_3 has wavelength characteristics of reflecting the light which has the wavelength band not less than 601 nm and transmitting the light which has the wavelength band not more than 600 nm. The dichroic mirror 66_4 has wavelength characteristics of reflecting the light which has the wavelength band not less than 651 nm and transmitting the light which has the wavelength band not more than 650 nm.

In the present embodiment, the dichroic mirror is used, but alternatively, a half mirror may also be used if the light amount is sufficient. When the computer 48 gives a command to the main control system 49 in accordance with the wavelength selecting condition for the measurement of the wafer mark WM, an LED which is to be used is selected and illuminated. For example, when the wavelength band "e" is selected in measuring the wafer mark WM, the main control system 49 illuminates the LED 65e. The light beam of the illuminated LED passes through an optical system 67 that collects the light beam on the incident end of the fiber 42 used for illuminating the reference mark SM, and is collected on the fiber 42. A light amount of the LED can be adjusted by changing a current value or a voltage value using the main control system 49. In this case, the LED may change the light amount value in accordance with the wavelength band that is to be used, or the storage time of the image sensor 11 may also be changed.

It is preferred that an LED which has a center wavelength in the wavelength band be adopted as an LED configured for each wavelength band if possible. For example, since the center wavelength in the wavelength band "b" is 575 nm, an LED which has a high luminance near the center wavelength may be selected. The present embodiment is not limited to the configuration where one kind of LED is provided for each wavelength band, and instead, may also be configured so as to include a plurality of kinds of LEDs for each wavelength band. In this case, the embodiment can be configured so as to freely select combinations of the LEDs to be illuminated in accordance with the condition.

In Embodiments 1 to 3 described above, the position measurement apparatus (the exposure apparatus) that uses the wafer mark measurement light and the reference mark measurement light each having the similar wavelength so as to reduce the measurement error caused by the wavelength difference is described. Even when the wavelengths of the wafer mark measurement light and the reference mark measurement light are different from each other, a method of previously obtaining a measurement error value in accordance with the wavelength difference to reflect it to the wafer mark measurement value can be adopted. When a plurality of reference lights are used, the measurement error value for each of the reference lights may be obtained. When a plurality of conditions of the wavelength of the waver mark measurement light exist, the measurement error value with respect to the reference light for each condition may be obtained.

[Embodiment 4]

Figure 10:
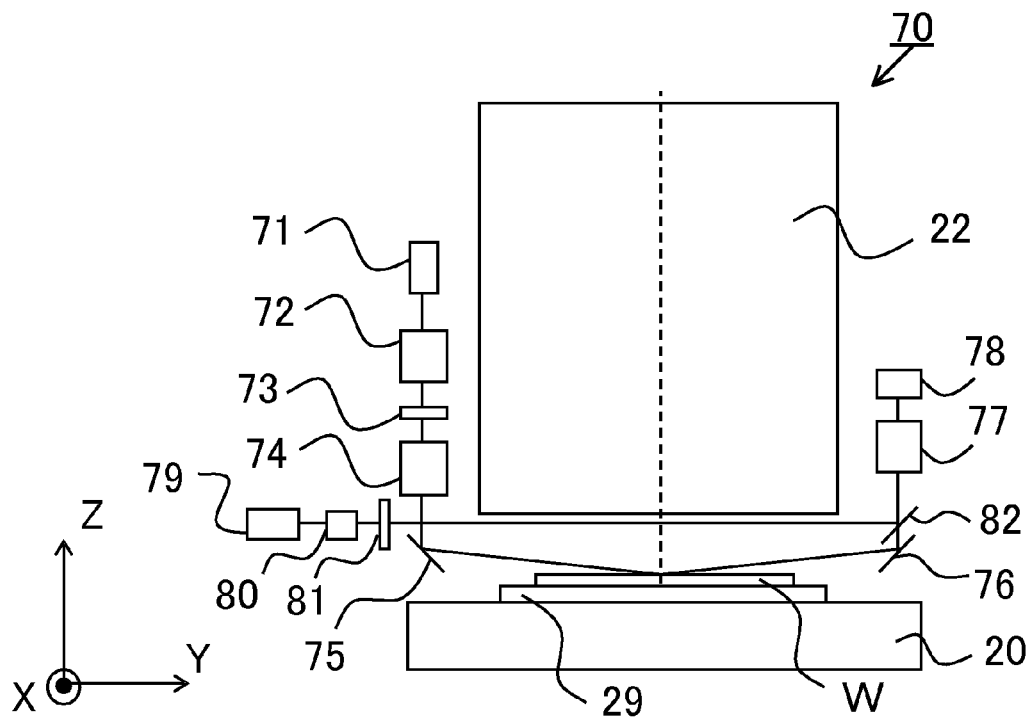
FIG. 10 is a configuration diagram of a focus measurement apparatus in Embodiment 4.

Next, referring to FIG. 10, Embodiment 4 of the present invention will be described. In the present embodiment, the position measurement apparatus is applied to a focus measurement apparatus 70 that measures a focus direction of the projection optical system 22. FIG. 10 is a configuration diagram of the focus measurement apparatus 70 (the position measurement apparatus) in the present embodiment.

In the focus measurement apparatus 70 (a focus detection system), the light emitted from an illumination light source 71 illuminates a slit 73 via an illumination lens 72. The light transmitting through the slit 73 images a slit pattern on a wafer W (an object) using an illumination optical system 74 (a first illumination optical system) and a mirror 75. The slit pattern projected on the wafer W is reflected on a surface of the wafer W, and enters a mirror 76 and a detection optical system 77 that are configured at a side opposite to the illumination optical system 74. The detection optical system 77 images (reimages) the slit pattern formed on the wafer W on a photoelectric conversion element 78.

Next, the reference light in the present embodiment will be described. The light emitted from a light source 79 of the reference light illuminates a reference light slit 81 via a reference light illumination lens 80 (a second illumination optical system). The light transmitting through the reference light slit 81 passes through the inside of the atmosphere under the projection optical system 22, and enters a reference light combining mirror 82 that combines the measurement light and the reference light and the detection optical system 77 that detects the combined light. The detection optical system 77 images (reimages) the reference light slit pattern on the photoelectric conversion element 78. A slit image on the photoelectric conversion element 78 is moved in accordance with the movement of the waver W up and down, and a position measurement unit (not shown) can measure a distance of the wafer W in a focus direction based on this moving amount. Commonly, a plurality of slits 73 (a plurality of points on the wafer W) are provided and each focus position is detected (multipoint measurement on the wafer W is performed) so as to measure a tilt of the wafer W with respect to an image plane of the image of the mask 17 of the projection optical system 22. As a result, since any one passes inside of substantially the same space, the same influence is received even if the passing air density is fluctuated. Therefore, the ways of the variations are equal to each other.

In the present embodiment, the illumination light source 71 and the light source 79 of the reference light are configured separately from each other, but similarly to each embodiment described above, an error of the measurement value caused by the wavelength difference can be reduced if the wavelength of the light source 79 of the reference light is set to be the same as that of the illumination light source 71. The light source 79 of the reference light may also be configured by including a plurality of light sources, and may also be commonly used with the illumination light source 71. The configuration of the OA detection system in Embodiments 1 and 2 can also be similarly applied to the focus measurement apparatus 70. Each of Embodiments 1 to 4 describes a position measurement apparatus or a surface position measurement apparatus at a wafer side, but the embodiment is not limited to this and it may also be applied to a position measurement apparatus or a surface position measurement apparatus configured at a mask side.

According to each embodiment, a position measurement apparatus that reduces a measurement error caused by a wavelength difference so as to perform highly accurate position measurement can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-249560, filed on Nov. 15, 2011, which is hereby incorporated by reference herein in its entirety.

What is claimed is:

1. A position measurement apparatus that measures a position of an object, the position measurement apparatus comprising:
   an image sensor;
   a first illumination optical system configured to illuminate a mark of the object using measurement light in a first wavelength band;
   an imaging optical system configured to cause light from the object illuminated by the measurement light in the first wavelength band to image on the image sensor;
   a reference mark configured to be arranged outside an optical path of the first illumination optical system and the imaging optical system;
   a second illumination optical system configured to illuminate the reference mark using reference light of a second wavelength band;
   an optical element configured to guide light from the reference mark illuminated by the reference light of the second wavelength band to the image sensor through the optical path of the imaging optical system; and
   a position measurement unit configured to detect the position of the object based on an image of the object and an image of the reference mark detected by the image sensor,
   wherein the second wavelength band of the reference light is set between an upper limit and a lower limit of the first wavelength band,
   wherein the optical element is a mirror which transmits a part of incident light and reflects another part of the incident light, and
   wherein an optical characteristic of the mirror is set so that light amount of light arriving at the image sensor from the object through the mirror is larger than that arriving at the image sensor from the reference mark through the mirror.

2. The apparatus according to claim 1, further comprising:
   a first light source configured to illuminate the mark of the object; and
   a second light source configured to illuminate the reference mark,
   wherein each of the first light source and the second light source is configured by at least one of a halogen lamp, an LED, a laser, and a laser diode.

3. The apparatus according to claim 2, wherein one light source unit is configured by commonly using the first light source and the second light source.

4. The apparatus according to claim 3, wherein the one light source unit has an optical path switching unit that switches an optical path used to illuminate the mark of the object and an optical path used to illuminate the reference mark.

5. The apparatus according to claim 3, wherein the second wavelength band of the reference light is selected in accordance with selection of the first wavelength band of the measurement light.

6. The apparatus according to claim 1, wherein light amounts of the reference light and the measurement light are adjustable independently of each other.

7. An exposure apparatus that exposes a pattern of a mask onto a substrate, the exposure apparatus comprising the position measurement apparatus according to claim 1,
   wherein the position measurement apparatus measures a position of the substrate as an object.

8. The apparatus according to claim 1, further comprising:
   a wavelength selection unit configured to select a wavelength of the measurement light for illuminating the mark of the object.
   wherein the wavelength selection unit can select the wavelength of the measurement light from a wavelength higher than the second wavelength band and a wavelength lower than the second wavelength band.

9. A position measurement apparatus that measures a position of an object, the position measurement apparatus comprising:
   an image sensor;
   a first illumination optical system configured to illuminate a mark of the object using measurement light in a first wavelength band;
   an imaging optical system configured to cause light from the object illuminated by the measurement light in the first wavelength band to image on the image sensor;
   a reference mark configured to be arranged outside an optical path of the first illumination optical system and the imaging optical system;
   a second illumination optical system configured to illuminate the reference mark using reference light of a second wavelength band;
   an optical element configured to guide light from the reference mark illuminated by the reference light of the second wavelength band to the image sensor through the optical path of the imaging optical system; and a position measurement unit configured to detect the position of the object based on an image of the object and an image of the reference mark detected by the image sensor, wherein the second wavelength band of the reference light is set between an upper limit and a lower limit of the first wavelength band, wherein the optical element is a mirror which transmits a part of incident light and reflects another part of the incident light, wherein a reflectance of the mirror is different from a transmittance of the mirror, wherein an optical characteristic of the higher of the reflectance and the transmittance makes light be guided from the object to the image sensor through the mirror, and wherein an optical characteristic of the lower of the reflectance and the transmittance makes light be guided from the reference mark to the image sensor through the mirror.

10. The apparatus according to claim 9, further comprising:
a first light source configured to illuminate the mark of the object; and
a second light source configured to illuminate the reference mark,
wherein each of the first light source and the second light source is configured by at least one of a halogen lamp, an LED, a laser, and a laser diode.

11. The apparatus according to claim 10, wherein one light source unit is configured by commonly using the first light source and the second light source.

12. The apparatus according to claim 11, wherein the one light source unit has an optical path switching unit that switches an optical path used to illuminate the mark of the object and an optical path used to illuminate the reference mark.

13. The apparatus according to claim 11, wherein the second wavelength band of the reference light is selected in accordance with selection of the first wavelength band of the measurement light.

14. The apparatus according to claim 9, wherein light amounts of the reference light and the measurement light are adjustable independently of each other.

15. An exposure apparatus that exposes a pattern of a mask onto a substrate, the exposure apparatus comprising the position measurement apparatus according to claim 9,
wherein the position measurement apparatus measures a position of the substrate as an object.

16. The apparatus according to claim 9, further comprising:
a wavelength selection unit configured to select a wavelength of the measurement light for illuminating the mark of the object,
wherein the wavelength selection unit can select the wavelength of the measurement light from a wavelength higher than the second wavelength band and a wavelength lower than the second wavelength band.

17. A position measurement apparatus that measures a position of an object, the position measurement apparatus comprising:
an image sensor;
a first illumination optical system configured to illuminate a mark of the object using measurement light in a first wavelength band;
an imaging optical system configured to cause light from the object illuminated by the measurement light in the first wavelength band to image on the image sensor;
a reference mark configured to be arranged outside an optical path of the first illumination optical system and the imaging optical system;
a second illumination optical system configured to illuminate the reference mark using reference light of a second wavelength band;
an optical element configured to guide light from the reference mark illuminated by the reference light of the second wavelength band to the image sensor through the optical path of the imaging optical system; and
a position measurement unit configured to detect the position of the object based on an image of the object and an image of the reference mark detected by the image sensor,
wherein the second wavelength band of the reference light is set between an upper limit and a lower limit of the first wavelength band,
wherein the optical element is a dichroic mirror,
wherein the dichroic mirror reflects one of light in the first wavelength band or light in the second wavelength band and transmits the other, and
wherein the dichroic mirror guides light from the object and light from the reference mark to the image sensor.

18. The apparatus according to claim 17, wherein a transmittance of the dichroic mirror in the second wavelength band is lower than a transmittance in the first wavelength band where the first wavelength band is higher than the second wavelength band and is lower than a transmittance in the first wavelength band where the first wavelength band is lower than the second wavelength band.

19. The apparatus according to claim 17, further comprising:
a first light source configured to illuminate the mark of the object; and
a second light source configured to illuminate the reference mark,
wherein each of the first light source and the second light source is configured by at least one of a halogen lamp, an LED, a laser, and a laser diode.

20. The apparatus according to claim 19, wherein one light source unit is configured by commonly using the first light source and the second light source.

21. The apparatus according to claim 20, wherein the one light source unit has an optical path switching unit that switches an optical path used to illuminate the mark of the object and an optical path used to illuminate the reference mark.

22. The apparatus according to claim 20, wherein the second wavelength band of the reference light is selected in accordance with selection of the first wavelength band of the measurement light.

23. The apparatus according to claim 17, wherein light amounts of the reference light and the measurement light are adjustable independently of each other.

24. An exposure apparatus that exposes a pattern of a mask onto a substrate, the exposure apparatus comprising the position measurement apparatus according to claim 17,
wherein the position measurement apparatus measures a position of the substrate as an object.

25. The apparatus according to claim 17, further comprising:
a wavelength selection unit configured to select a wavelength of the measurement light for illuminating the mark of the object,
wherein the wavelength selection unit can select the wavelength of the measurement light from a wavelength higher than the second wavelength band and a wavelength lower than the second wavelength band.

26. A method of manufacturing a device, the method comprising:
exposing a substrate using an exposure apparatus; and developing the exposed substrate,
wherein the exposure apparatus exposes a pattern of a mask onto the substrate,
wherein the exposure apparatus comprises a position measurement apparatus,
wherein the position measurement apparatus comprises:
(a) an image sensor;
(b) a first illumination optical system configured to illuminate a mark of the an object using measurement light in a first wavelength band;
(c) an imaging optical system configured to cause light from the object illuminated by the measurement light in the first wavelength band to image on the image sensor;
(d) a reference mark configured to be arranged outside an optical path of the first illumination optical system and the imaging optical system;
(e) a second illumination optical system configured to illuminate the reference mark using reference light of a second wavelength band;
(f) an optical element configured to guide light from the reference mark illuminated by the reference light of the second wavelength band to the image sensor through the optical path of the imaging optical system; and
(g) a position measurement unit configured to detect the position of the object based on an image of the object and an image of the reference mark detected by the image sensor,
wherein the second wavelength band of the reference light is set between an upper limit and a lower limit of the first wavelength band,
wherein the optical element is a mirror which transmits a part of incident light and reflects another part of the incident light, and
wherein an optical characteristic of the mirror is set so that light amount of light arriving at the image sensor from the object through the mirror is larger than that arriving at the image sensor from the reference mark through the mirror.

27. A method of manufacturing a device, the method comprising:
exposing a substrate using an exposure apparatus; and developing the exposed substrate,
wherein the exposure apparatus exposes a pattern of a mask onto the substrate,
wherein the exposure apparatus comprises a position measurement apparatus,
wherein the position measurement apparatus comprises:
(a) an image sensor;
(b) a first illumination optical system configured to illuminate a mark of the an object using measurement light in a first wavelength band;
(c) an imaging optical system configured to cause light from the object illuminated by the measurement light in the first wavelength band to image on the image sensor;
(d) a reference mark configured to be arranged outside an optical path of the first illumination optical system and the imaging optical system;
(e) a second illumination optical system configured to illuminate the reference mark using reference light of a second wavelength band;
(f) an optical element configured to guide light from the reference mark illuminated by the reference light of the second wavelength band to the image sensor through the optical path of the imaging optical system; and
(g) a position measurement unit configured to detect the position of the object based on an image of the object and an image of the reference mark detected by the image sensor,
wherein the second wavelength band of the reference light is set between an upper limit and a lower limit of the first wavelength band,
wherein the optical element is a mirror which transmits a part of incident light and reflects another part of the incident light,
wherein a reflectance of the mirror is different from a transmittance of the mirror,
wherein an optical characteristic of the higher of the reflectance and the transmittance makes light be guided from the object to the image sensor through the mirror, and
wherein an optical characteristic of the lower of the reflectance and the transmittance makes light be guided from the reference mark to the image sensor through the mirror.

28. A method of manufacturing a device, the method comprising:
exposing a substrate using an exposure apparatus; and developing the exposed substrate,
wherein the exposure apparatus exposes a pattern of a mask onto the substrate,
wherein the exposure apparatus comprises a position measurement apparatus,
wherein the position measurement apparatus comprises:
(a) an image sensor;
(b) a first illumination optical system configured to illuminate a mark of the an object using measurement light in a first wavelength band;
(c) an imaging optical system configured to cause light from the object illuminated by the measurement light in the first wavelength band to image on the image sensor;
(d) a reference mark configured to be arranged outside an optical path of the first illumination optical system and the imaging optical system;
(e) a second illumination optical system configured to illuminate the reference mark using reference light of a second wavelength band;
(f) an optical element configured to guide light from the reference mark illuminated by the reference light of the second wavelength band to the image sensor through the optical path of the imaging optical system; and
(g) a position measurement unit configured to detect the position of the object based on an image of the object and an image of the reference mark detected by the image sensor,
wherein the second wavelength band of the reference light is set between an upper limit and a lower limit of the first wavelength band,
wherein the optical element is a dichroic mirror,
wherein the dichroic mirror reflects one of light in the first wavelength band or light in the second wavelength band and transmits the other, and
wherein the dichroic mirror guides light from the object and light from the reference mark to the image sensor.

* * * * *